(12) United States Patent
Alsabah et al.

(10) Patent No.: US 9,298,277 B1
(45) Date of Patent: Mar. 29, 2016

(54) METHOD FOR TYPING ARABIC LETTERS AND ASSOCIATED DIACRITICS

(71) Applicants: Sheikha Sheikha Salem Alsabah, Shuwaikh (KW); Jamal Alrifai, Mishref (KW); Majed Aly, Bnaid Algar (KW)

(72) Inventors: Sheikha Sheikha Salem Alsabah, Shuwaikh (KW); Jamal Alrifai, Mishref (KW); Majed Aly, Bnaid Algar (KW)

( * ) Notice: Subject to any disclaimer, the term of this patent is extended or adjusted under 35 U.S.C. 154(b) by 0 days.

(21) Appl. No.: 14/956,749

(22) Filed: Dec. 2, 2015

(51) Int. Cl.
*G06F 3/023* (2006.01)
*G06F 3/02* (2006.01)
*G06F 17/22* (2006.01)
*H03M 11/14* (2006.01)

(52) U.S. Cl.
CPC ............ *G06F 3/0233* (2013.01); *G06F 3/0202* (2013.01); *G06F 17/2223* (2013.01); *H03M 11/14* (2013.01)

(58) Field of Classification Search
CPC ........ B41J 5/107; G06F 3/0202; H03M 11/14
USPC .......................................... 400/484
See application file for complete search history.

(56) References Cited

U.S. PATENT DOCUMENTS

| 4,176,974 | A | * | 12/1979 | Bishai | G06F 17/2863 400/111 |
| 4,527,919 | A | * | 7/1985 | Aoun | B41J 3/01 178/30 |
| 4,670,842 | A | * | 6/1987 | Metwaly | G09G 5/246 400/111 |
| 8,531,405 | B2 | | 9/2013 | Khoury | |
| 2006/0100848 | A1 | | 5/2006 | Cozzi et al. | |
| 2013/0271382 | A1 | | 10/2013 | Khan | |
| 2013/0335331 | A1 | | 12/2013 | Osman | |

FOREIGN PATENT DOCUMENTS

WO    WO 2010/094121 A1    8/2010

* cited by examiner

*Primary Examiner* — Daniel J Colilla
(74) *Attorney, Agent, or Firm* — Richard C. Litman

(57) ABSTRACT

The method for typing in Arabic includes using a keyboard having conventional key sets, such as, function keys, numeric keys, specialized command keys, a spacebar, left and right shift keys, a backspace key and a set of alphabet keys. Each of the alphabet keys includes indicia representing a first letter of a first alphabet and a second letter of a second alphabet. Actuation of a combination of the left shift key and an alt key switches functionality of each of the alphabet keys from displaying the first letter associated therewith, upon actuation of the respective key, to displaying the second letter associated therewith. A default function associated with each of the alphabet keys displays a first diacritic associated with the first alphabet in combination with the respective first letter. Subsequent actuation of the backspace key removes the display of the first diacritic from the respective first letter.

9 Claims, 9 Drawing Sheets

METHOD FOR TYPING ARABIC LETTERS AND ASSOCIATED DIACRITICS

BACKGROUND OF THE INVENTION

1. Field of the Invention

The present invention relates generally to a method for typing in a non-English language, and particularly to a method for typing Arabic letters and associated diacritics.

2. Description of the Related Art

Current standard keyboards, often referred to as the "QWERTY" keyboard or ASCII keyboard, are specifically designed for users typing in the English language (Latin alphabet). In order for a standard English language keyboard to be used for typing letters in other languages, it can be modified, by providing software computer means that supports this language. To assist the user, most of the letters of the other language can be printed on the keyboard beside the English letters. This enables the user to type in English mode or in the other language mode, as desired. Such keyboards, however, are typically limited to assigning a letter from a first alphabet and a letter from a second alphabet to each alphabet and/or punctuation key of the keyboard.

Unlike the English language, however, the Arabic language includes the usage of diacritics to represent vowel sounds. The Arabic fathah, for example, is a small diagonal line placed above a letter, and represents a short/a/. The kasrah is a similar diagonal line below a letter and designates a long/e/(as in "team"). The dammah is a small curl-like diacritic placed above a letter to represent a double/oo/(as in "room"). Since the vowels in English are unique letters, there is no correspondence between the English alphabet and the diacritics used in Arabic. Although Arabic and English bilingual keyboards are known, such keyboards typically do not provide any ability to use diacritics, or require complex manipulations.

Thus, a method for typing Arabic letters and associated diacritics addressing the aforementioned problems is desired.

SUMMARY OF THE INVENTION

The method for typing Arabic letters and associated diacritics includes using a keyboard including conventional key sets, such as, for example, function keys, numeric keys, specialized command keys, a spacebar, left and right shift keys, a backspace key and a set of alphabet and punctuation keys, typically associated with a standard keyboard. Each of the alphabet keys includes a first letter of a first alphabet and a second letter of a second alphabet. For example, each alphabet key can include a letter from the Arabic alphabet and also a letter from the English alphabet. The specialized command keys may include, for example, conventional control, alt and command (or "cmd", as it is conventionally represented) keys.

Actuation of a combination of the left shift key and the alt key switches a functionality mode from one language to another. In the example of the Arabic and English alphabets, actuation of a selected alphabet key may display the Arabic letter associated with that key. If the user simultaneously actuates the left shift key and the alt key, the overall alphabet mode is then switched to the second language (i.e., English in this example), and actuation of the same key will display the English letter associated therewith.

Upon actuation of a selected alphabet key in the Arabic alphabet mode, a default function associated with each of the alphabet keys displays a first diacritic in combination with the respective Arabic letter. Subsequent actuation of the backspace key removes the display of the first diacritic from the respective letter. Simultaneous actuation of the left shift key and one of the alphabet keys displays a second diacritic in combination with the respective first letter, and simultaneous actuation of the right shift key and one of the alphabet keys displays a third diacritic in combination with the respective first letter. The first diacritic may be a fathah, the second diacritic may be a dammah, and the third diacritic may be a kasrah.

These and other features of the present invention will become readily apparent upon further review of the following specification and drawings.

BRIEF DESCRIPTION OF THE DRAWINGS

Unless otherwise indicated, similar reference characters denote corresponding features consistently throughout the attached drawings.

DETAILED DESCRIPTION OF THE PREFERRED EMBODIMENTS

Figure 1:
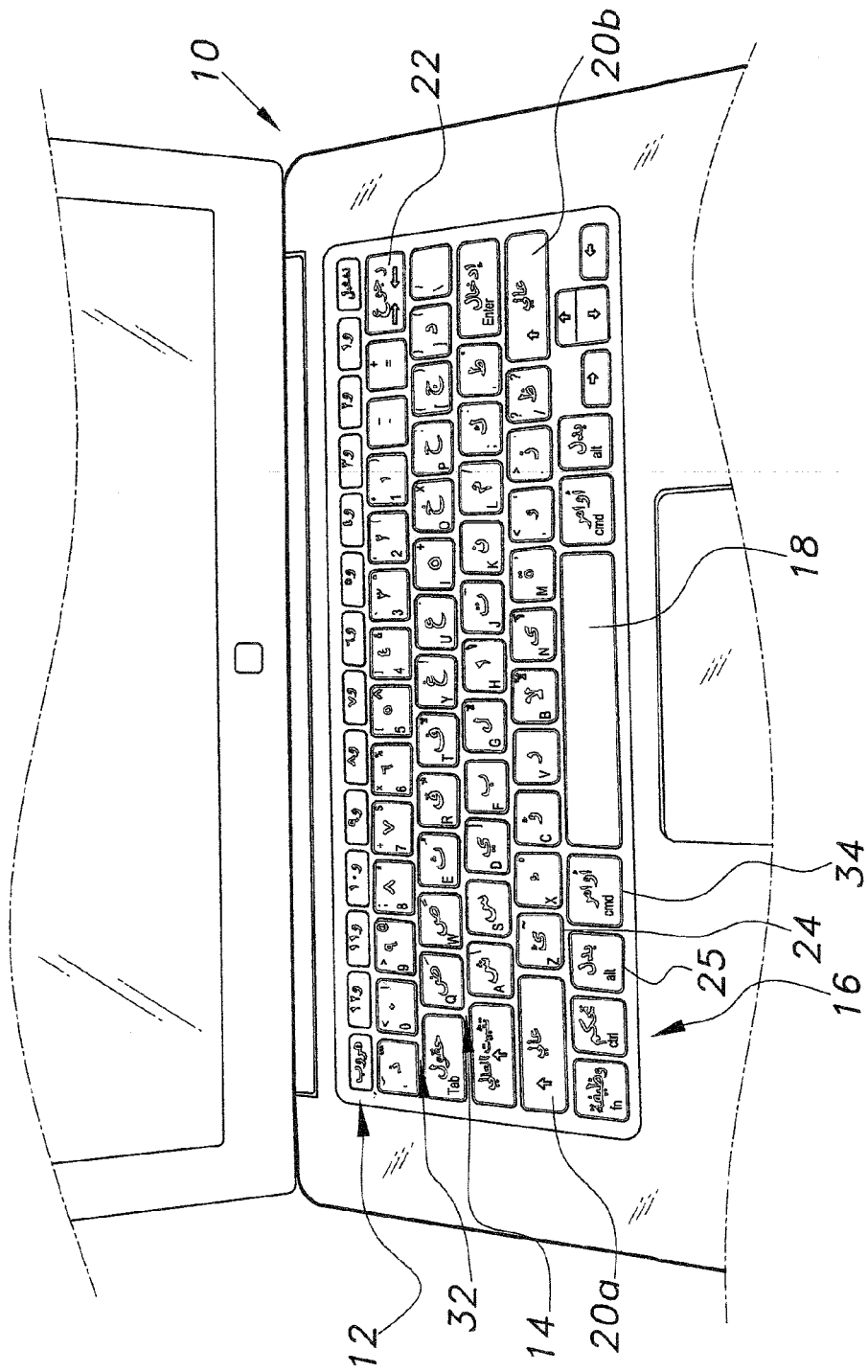
FIG. 1 shows a key layout of a bilingual keyboard with diacritics according to the present teachings.

As shown in FIG. 1, the method for typing Arabic letters and associated diacritics includes using a keyboard 10 including conventional QWERTY key sets, such as, a set of function keys 12, a set of number keys 32, specialized command keys 16, a spacebar 18, left and right shift keys, 20a, 20b, respectively, a backspace key 22 and a set of alphabet keys 14. Although QWERTY key sets are described herein, close variants of QWERTY key sets (as known in the art) may also be used. The keyboard 10 can be configured to operate in at least two different language modes. For example, the keyboard 10 can operate in an English language mode and in an Arabic language mode. The keyboard 10 is operable with an extended-ASCII code. The extended-ASCII code includes ASCII code that has been expanded to associate standard QWERTY key sets with letters, numbers, and diacritics commonly used for writing in the Arabic language or other languages in which diacritics are used. For example, in the English-language mode, the keyboard 10 operates as a standard ASCII keyboard. In the Arabic language mode, the typing of the Arabic letters is implemented from right to left. In addition, the extended-ASCII code for keyboard 10 associates each of a set of first keys of the standard keyboard with a respective Arabic letter such that actuating one of the first keys displays the respective Arabic letter in combination with a first diacritic in the Arabic language; ii) one or more of a set of second keys of the keyboard with switching the functionality of the keyboard to either English or Arabic; iii) each of the set of first keys in combination with a right shift key of the English letter keyboard with at least a second diacritic, and iv) each of the set of first keys in combination with a left shift key of the English letter keyboard with at least a third diacritic.

Figure 2:
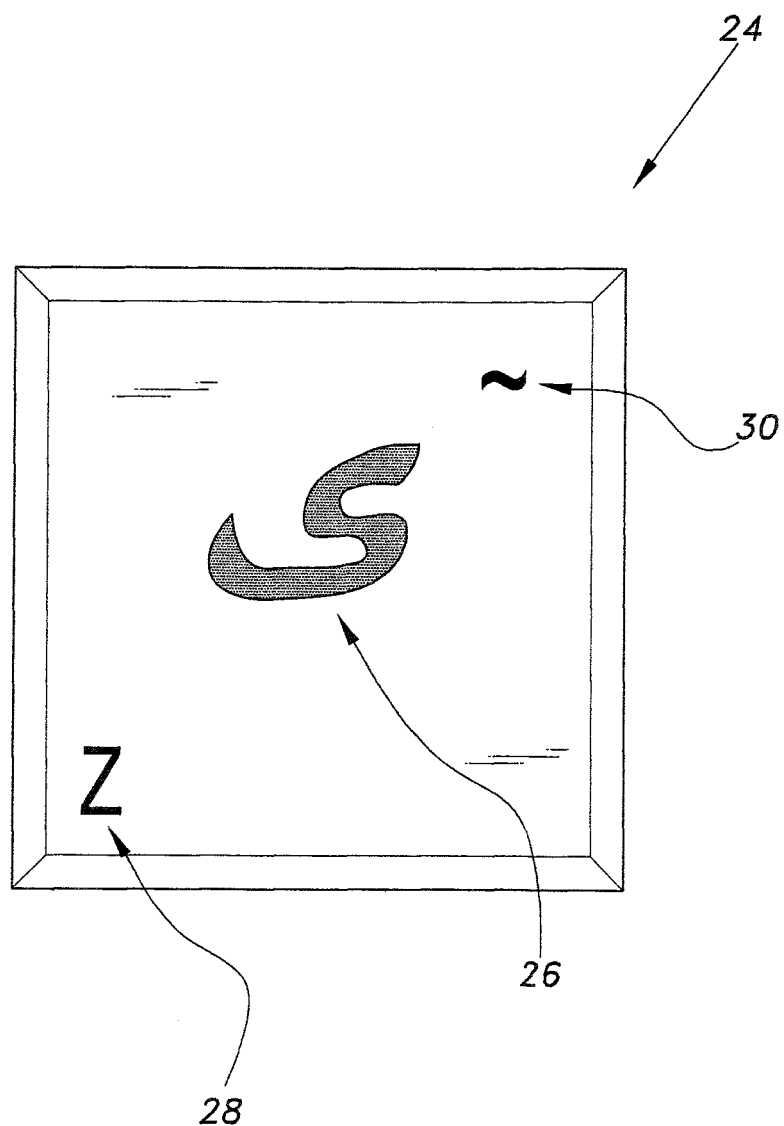
FIG. 2 is a plan view of an exemplary alphabet key of the bilingual keyboard with diacritics.

As best shown in FIG. 2, the first set of keys can include alphabet keys 14 as well as punctuation keys typically appearing in the same row as the alphabet keys 14 on a standard English keyboard. Each of the first set of keys includes a letter from the Arabic alphabet and a letter from the English alphabet, although it should be understood that the selection of these two particular languages is for exemplary purposes only and that any other languages can be selected instead. In FIG. 2, the particular exemplary key 24 includes a letter 26 in Arabic and a letter 28 in English. The font size of the letter 26 can be greater than, less than, or equal to the font size of the letter 28. It should be understood that the Arabic "yaa" 26 and the English "Z" 28 are shown for exemplary purposes only.

Each number key 32 can include a number typically appearing on a standard English keyboard and an East Arabic number. It should be understood that while numbers typically appearing on English keyboards are also referred to as "arabic" numbers, these "arabic" numbers are to be distinguished from East Arabic numbers typically used in Arabic speaking countries. Additionally, each alphabet key 14 and each number key 32 may include one or more secondary characters 30 in the upper right corner, upper left corner, or both corners of the respective key. The secondary characters 30 may be accessed by actuating the respective key in combination with one other key. For example, in FIG. 2, the tilde 30, shown in the upper right corner of alphabet key 14 may be accessed by actuation of the cmd key 34 and the alphabet key 24 in combination when the keyboard 10 is set on the Arabic language mode. Actuation of the left shift key 20a in combination with number key 12 accesses the secondary character 30 appearing on the upper right corner of the key 12. Actuation of the right shift key 20b in combination with number key 12 accesses the character 30 appearing on the upper left corner of the key 12.

Returning to FIG. 1, it should be understood that the overall keyboard layout, the associated housing, the laptop computer and display are shown for exemplary purposes only, and that the bilingual keyboard with diacritics 10 may be used in combination with any suitable type of computer or computerized system, and characters typed therewith may be displayed on any suitable type of monitor or other display. It should also be understood that the exemplary layout of keys in FIG. 1 is shown for exemplary purposes only, and that groupings of keys may be varied. For example, the function keys 12 (corresponding to conventional function keys, such as "F1", "F2", etc.) and the row of numeric keys 32 are shown in order from right to left, but may be reversed without departing from the spirit or scope of the present invention. Additionally, it should be understood that the alphabet keys 14 may be used in combination with any suitable pairings of conventional keyboard keys.

The second set of keys can include specialized command keys. The specialized command keys include, for example, a conventional control key 16, a conventional alt key 25 and a conventional command or "cmd" key 34, although it should be understood that any other suitable type of keys may be added thereto or substituted therefor. As an example, the command key 34 may be replaced by a "Windows" key on a keyboard designed for use with Microsoft Windows. Additionally, the function keys 12 and the numeric keys 32 may include additional secondary characters in the upper right and/or left corners of the keys, which may be accessed in combination with one of left or right shift keys 20a, 20b, as in a conventional keyboard. The secondary characters 12 on the numeric keys 32 can include, for example, punctuation marks, mathematical operators, to be accessed in the Arabic language mode.

Figure 3A:
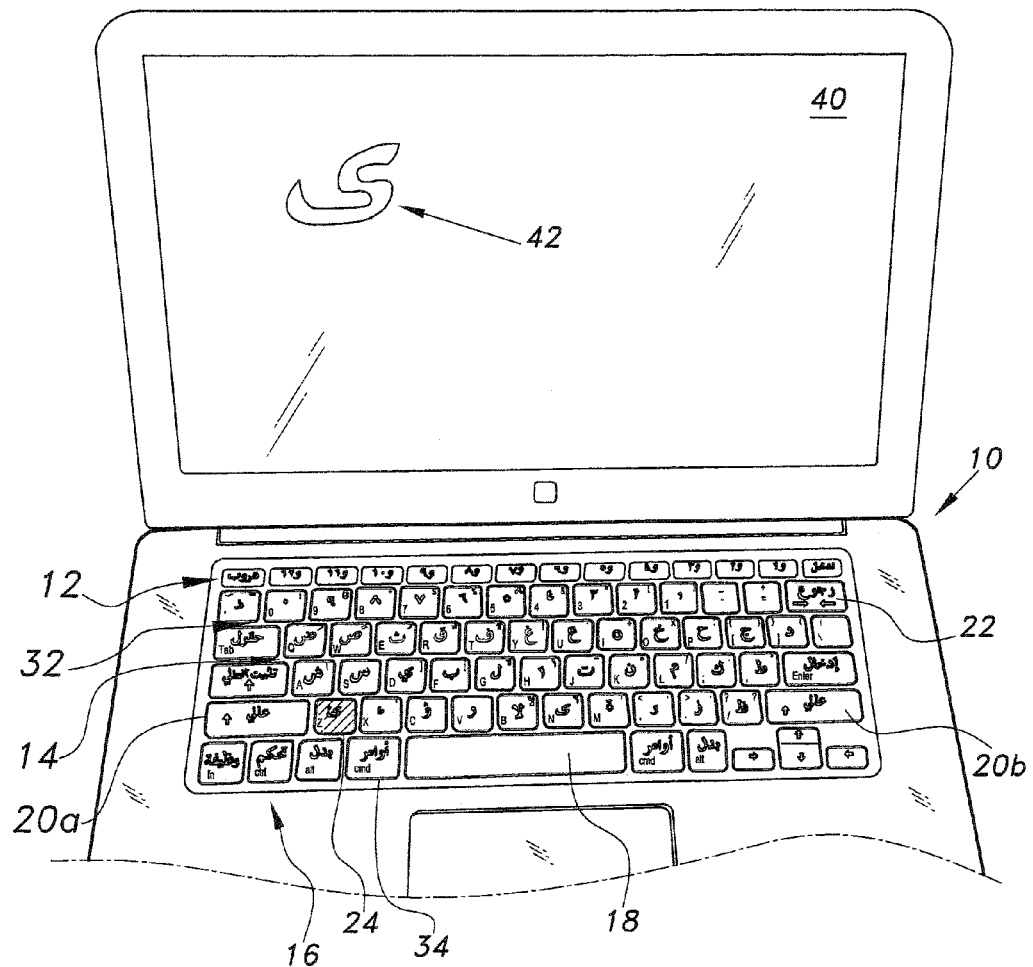
FIG. 3A illustrates a first operational mode of the bilingual keyboard with diacritics, specifically showing display of a letter in a first alphabet associated with the key shown in FIG. 2.
Figure 3B:
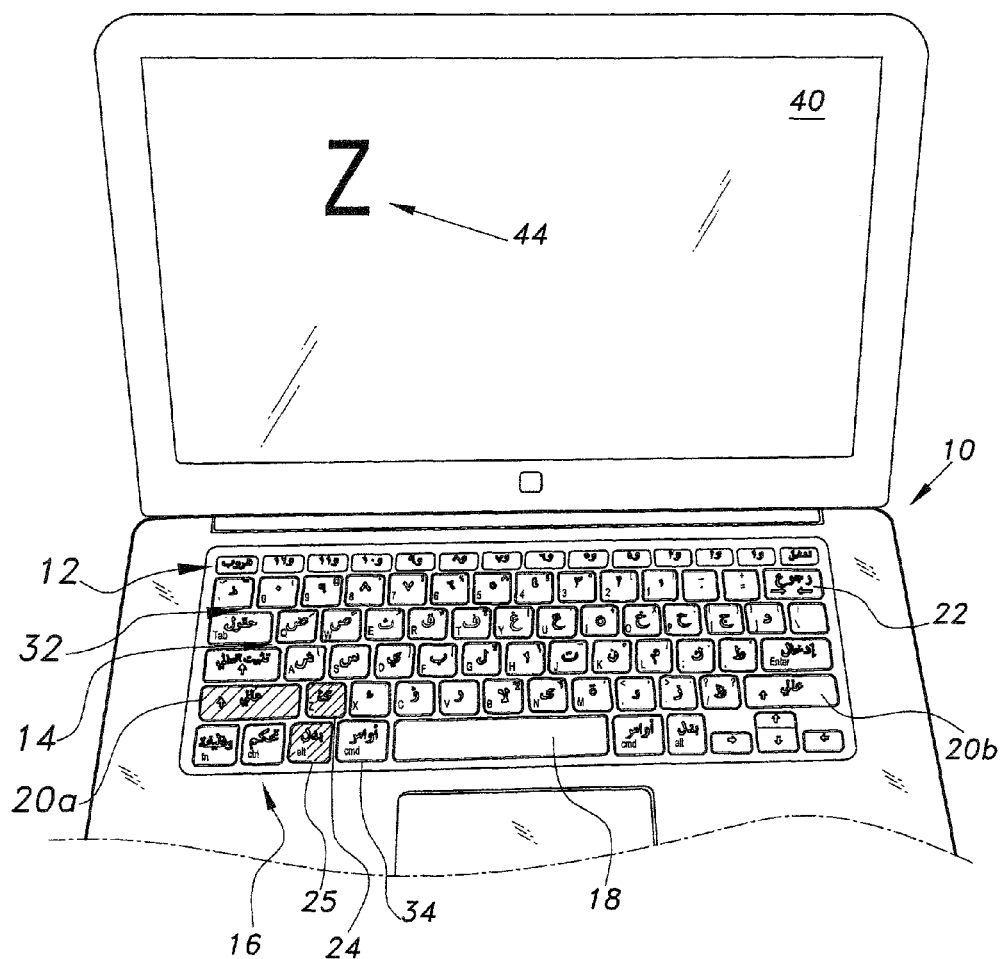
FIG. 3B illustrates a second operational mode of the bilingual keyboard with diacritics, specifically showing display of a letter in a second alphabet associated with the key shown in FIG. 2.
Figure 3C:
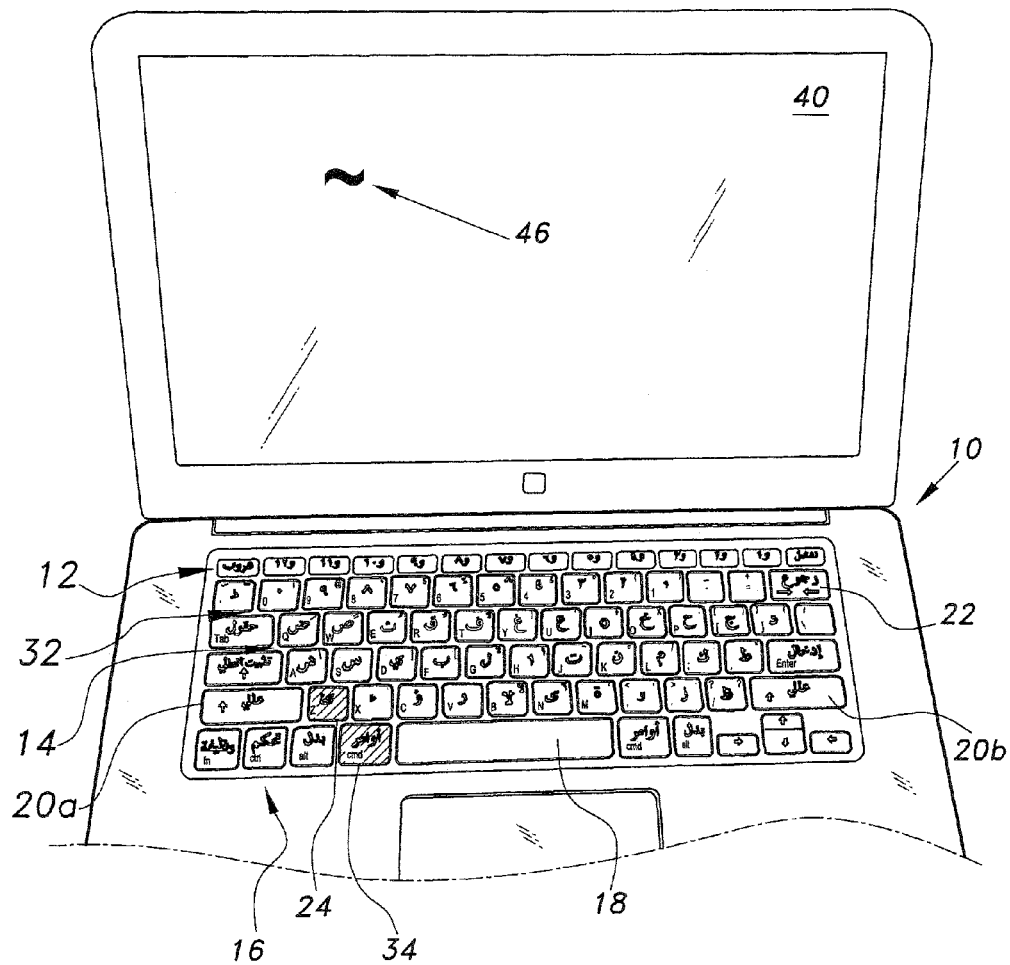
FIG. 3C illustrates a third operational mode of the bilingual keyboard with diacritics, specifically showing display of a secondary character associated with the key shown in FIG. 2.

In FIG. 3A, key 24 (of FIG. 2) is depressed and, in a first mode of operation, the primary character "yaa" 42 is displayed on display 40 of the computer; i.e., in the initial mode of operation, actuation of one of alphabet keys 14 displays a letter in the first alphabet. As shown in FIG. 3B, in order to switch operation to the display of the second alphabet, the user simultaneously actuates the combination of the left shift key 20a and the alt key 25. This combination switches functionality of each of the alphabet keys 14 from displaying the first letter associated therewith (the Arabic "yaa" 42 in the example of FIG. 3A) to displaying the second letter associated therewith; i.e., the English "Z" 44 in this example. Following the switch to the second language (English in this example), the change between upper and lower case (which does not exist in the Arabic language) may be controlled by the shift keys or the "caps lock" key, as in a conventional English keyboard. As shown in FIG. 3C, the secondary character (tilde 46 in this example) associated with key 24 may be displayed by the user simultaneously actuating the combination of the command key 34 and key 24. It should be understood that diacritics other than the tilde 46 (e.g., dammah, fathah, and kasra) may similarly appear on other alphabet keys 24 and be accessed in a similar fashion to provide an alternative method of accessing these diacritics. For these keys, simultaneously actuating the command key 34 once and the alphabet key 24 twice displays the respective diacritic twice over the respective Arabic letter to produce a different diacritic (e.g., damatan, fathatan, and kasratan).

Figure 3D:
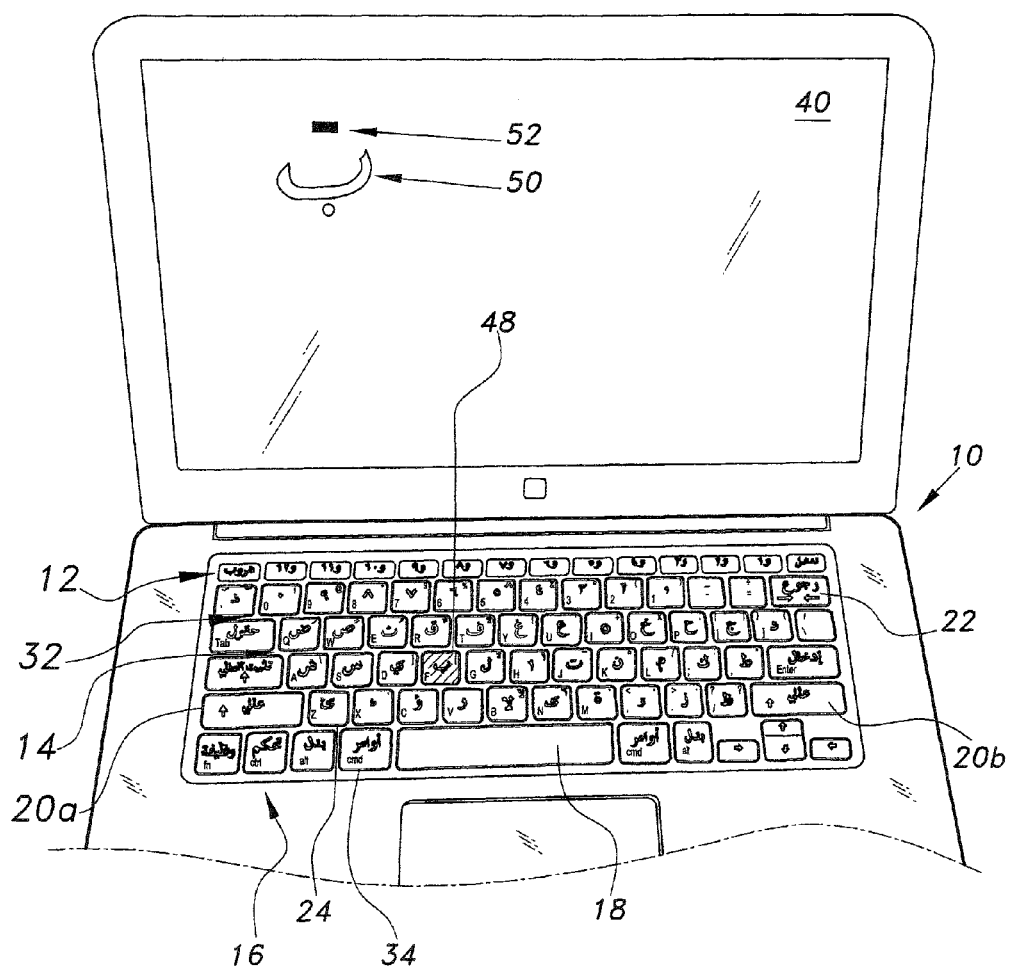
FIG. 3D illustrates a default display associated with another exemplary alphabet key of the bilingual keyboard with diacritics, specifically showing display of a letter in the first alphabet associated with the key and a first diacritic.

As discussed previously, a default function associated with each of the alphabet keys 14 displays a first diacritic associated with the first alphabet in combination with the respective first letter. In the example of FIG. 3D, the user actuates key 48, which includes the Arabic "baa" and the English letter "F". In the preferred default mode, as shown, the Arabic "baa" 50 is displayed on display 40 with the "fathah" diacritic 52 added thereto.

Figure 3E:
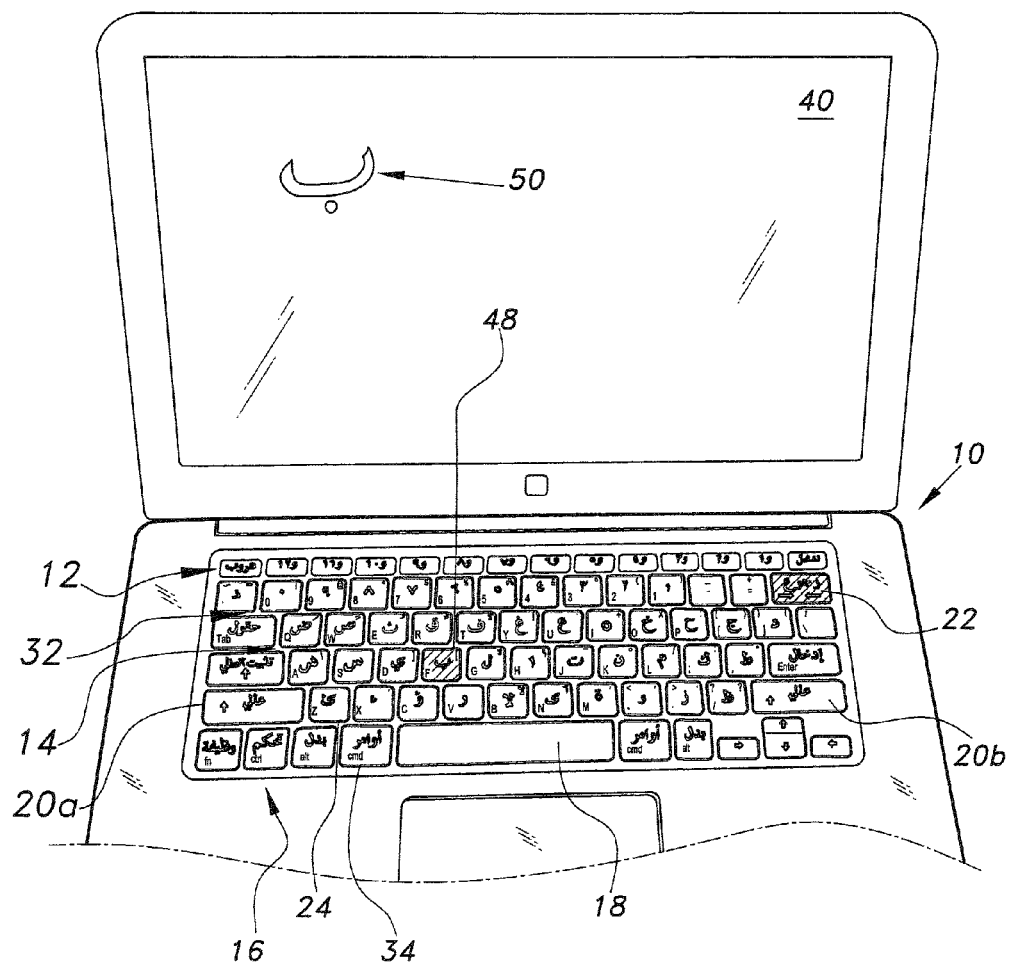
FIG. 3E illustrates a further operational mode of the bilingual keyboard with diacritics, specifically showing removal of the first diacritic from the letter of the first alphabet of FIG. 3D.
Figure 3F:
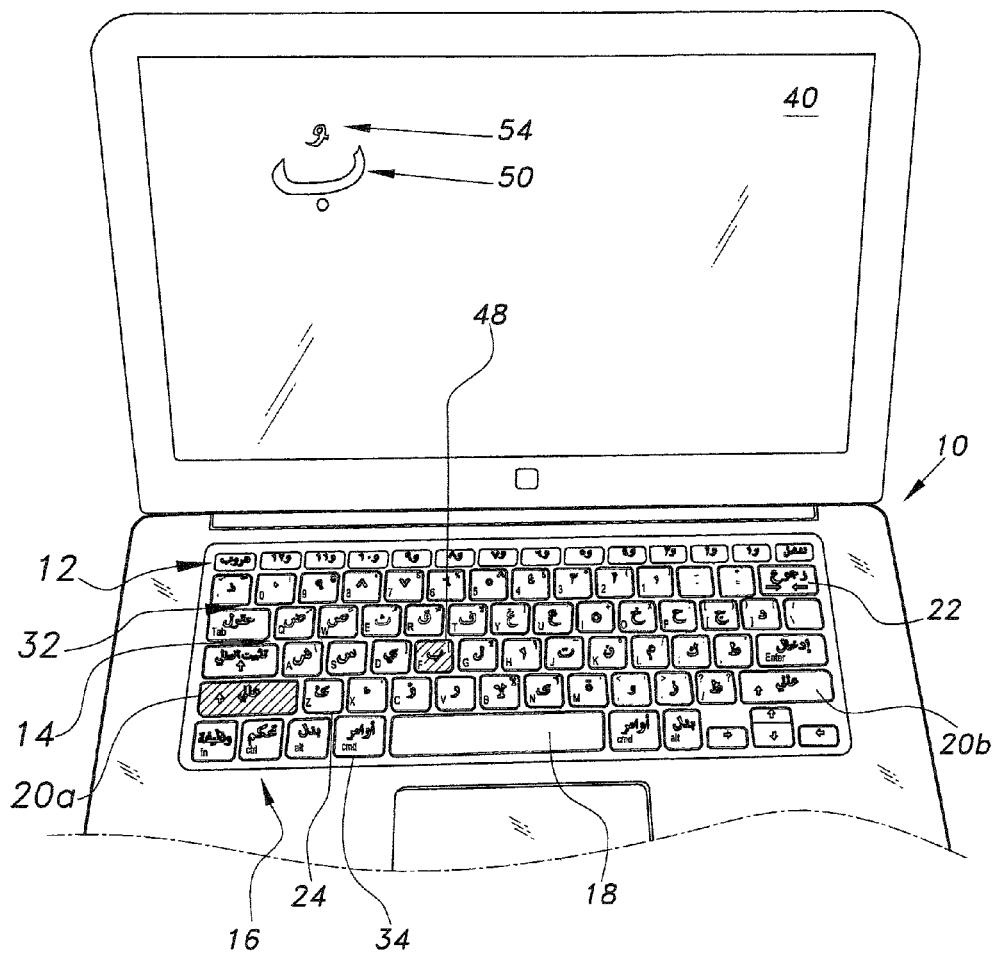
FIG. 3F illustrates an additional operational mode of the bilingual keyboard with diacritics, specifically showing addition of a second diacritic to the letter of the first alphabet of FIG. 3D.
Figure 3G:
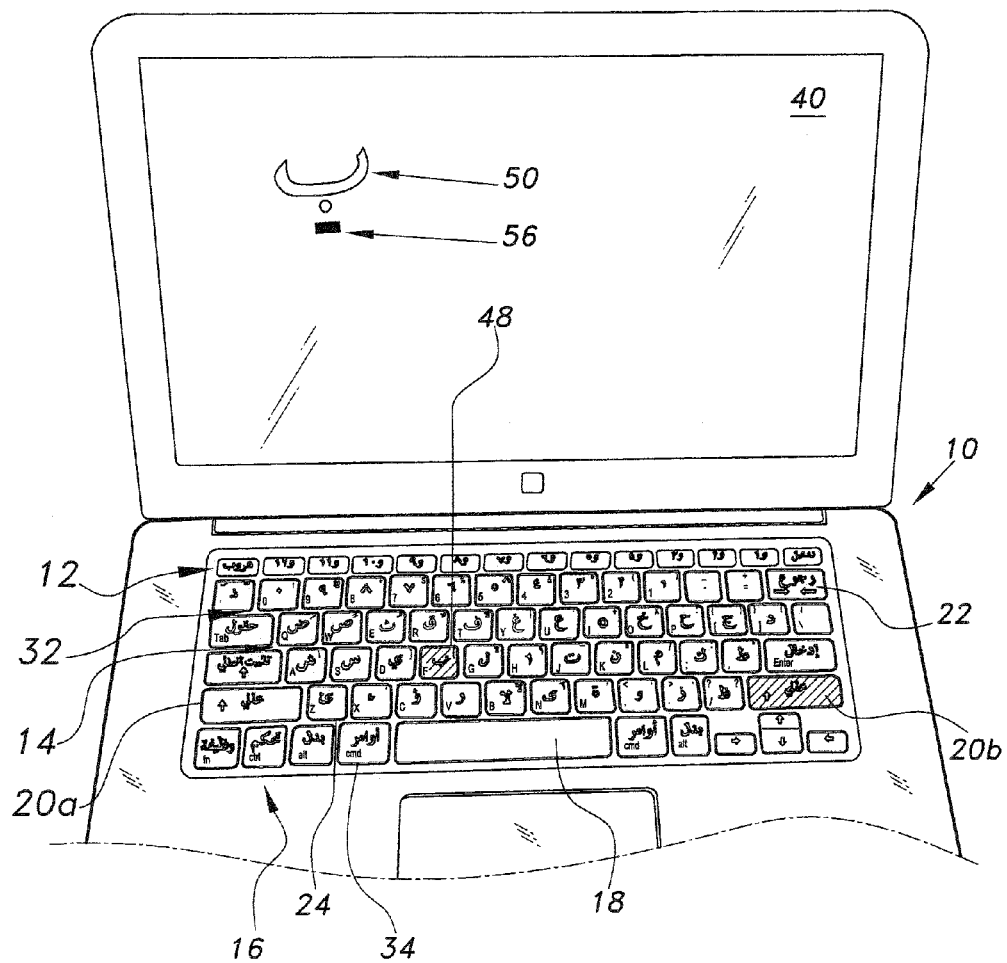
FIG. 3G illustrates another additional operational mode of the bilingual keyboard with diacritics, specifically showing addition of a third diacritic to the letter of the first alphabet of FIG. 3D.

As shown in FIG. 3E, subsequent actuation of the backspace key 22 removes the display of the first diacritic 52 from the respective first letter; i.e., only the "baa" 50 is displayed. As shown in FIG. 3F, simultaneous actuation of the left shift key 20a and one of the alphabet keys 14 displays a second diacritic associated with the first alphabet in combination with the respective first letter. In this particular example, the combination of the left shift key 20a with key 48 displays the Arabic "baa" 50 in combination with the Arabic diacritic "dammah" 54. Similarly, simultaneous actuation of the right shift key 20b and one of alphabet keys 14 displays a third diacritic associated with the first alphabet in combination with the respective first letter. In the example of FIG. 3G, the combination of the right shift key 20*b* with key 48 displays the Arabic "baa" 50 in combination with the Arabic diacritic "kasrah" 56.

It should be understood that control over the above displays associated with actuation of keys (and combinations of keys) as described above may be provided by any suitable hardware and/or software and/or firmware associated with the keyboard 10 and/or the computer in communication with keyboard 10, as is well known in the art of computer interfaces.

It is to be understood that the present invention is not limited to the embodiments described above, but encompasses any and all embodiments within the scope of the following claims.

We claim:

1. A method for typing Arabic letters and associated diacritics, comprising: a) providing an extended ASCII code for associating: i) each of a set of first keys of a standard English letter keyboard with a respective Arabic letter such that actuating one of the first keys displays the respective Arabic letter in combination with a first diacritic in the Arabic language; ii) one or more of a set of second keys of the English letter keyboard with switching the functionality of the keyboard to either English or Arabic; and iii) each of the set of first keys in combination with a left shift key of the English letter keyboard with at least a second diacritic, and iv) each of the set of first keys in combination with a right shift key of the English letter keyboard with at least a third diacritic; b) applying indicia to each of the set of first keys to represent a respective Arabic letter; and c) typing in Arabic by clicking on a desired series of the first keys after selecting an Arabic language functionality of the keyboard.

2. The method for typing in Arabic as recited in claim 1, wherein typing in Arabic further comprises clicking the left shift key in combination with one of said first set of keys.

3. The method for typing in Arabic as recited in claim 2, wherein typing in Arabic further comprises clicking the right shift key in combination with one of said first set of keys.

4. The method for typing in Arabic as recited in claim 1, wherein the extended ASCII code further associates each of a set of standard English number keys of said English letter keyboard with a respective East Arabic numeral such that actuating one of the first keys displays the respective East Arabic numeral.

5. The method for typing in Arabic as recited in claim 1, wherein the first diacritic is a fathah, the second diacritic is a dammah, and the third diacritic is a kasrah.

6. The method for typing in Arabic as recited in claim 1, wherein the second set of keys includes at least one specialized command key and wherein typing in Arabic further comprises actuating the at least one specialized command key in combination with one of said first set of keys to display a secondary character depicted on the respective first key.

7. The method for typing in Arabic as recited in claim 1, wherein at least some of the set of first keys further include indicia representing English letters.

8. The method for typing in Arabic as recited in claim 1, wherein the extended ASCII code further associates a single actuation of the backspace key subsequent to actuation of one of the first set of keys with removal of the display of the first diacritic from the respective Arabic letter.

9. A keyboard system for typing in Arabic using a standard English letter keyboard comprising: a) a standard English letter keyboard; and b) computer means provided with software for expanding the existing ASCII code of said English letter keyboard so as to associate: i) each of a set of first keys of said English letter keyboard with a respective Arabic letter such that actuating one of the first keys displays the respective Arabic letter in combination with a first diacritic in the Arabic language; ii) one or more of a set of second keys of said English letter keyboard with switching the functionality of the keyboard to either English or Arabic; and iii) each of the set of first keys in combination with a left shift key of the English letter keyboard with at least a second diacritic, and iv) each of the set of first keys in combination with a right shift key of the English letter keyboard with at least a third diacritic, wherein words or sentences in Arabic are typable upon clicking on a desired series of said first keys.

* * * * *